(12) United States Patent
Tanaka

(10) Patent No.: US 7,678,660 B2
(45) Date of Patent: Mar. 16, 2010

(54) CAPACITOR DEVICE AND METHOD OF MANUFACTURING THE SAME

(75) Inventor: Koichi Tanaka, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 342 days.

(21) Appl. No.: 11/252,597

(22) Filed: Oct. 19, 2005

(65) Prior Publication Data

US 2006/0086964 A1   Apr. 27, 2006

(30) Foreign Application Priority Data

Oct. 27, 2004   (JP) ............................. 2004-312744

(51) Int. Cl.
*H01L 21/20* (2006.01)
(52) U.S. Cl. ................ 438/396; 438/386; 438/387; 438/622; 438/637; 438/638; 438/700
(58) Field of Classification Search ......... 438/386–387, 438/396, 622, 637, 638, 700
See application file for complete search history.

(56) References Cited

U.S. PATENT DOCUMENTS

| | | | |
|---|---|---|---|
| 6,783,652 B2 | | 8/2004 | Iijima et al. |
| 6,921,689 B2 * | | 7/2005 | Matsuhashi ............... 438/240 |
| 2002/0066672 A1 * | | 6/2002 | Iijima et al. ............... 205/125 |
| 2002/0182802 A1 * | | 12/2002 | Tanaka et al. ............ 438/240 |
| 2003/0228734 A1 * | | 12/2003 | Natsume et al. .......... 438/253 |
| 2004/0207043 A1 * | | 10/2004 | Matsunaga et al. ........ 257/534 |
| 2004/0245556 A1 * | | 12/2004 | Farooq et al. ............. 257/296 |
| 2005/0227497 A1 * | | 10/2005 | Padovani .................. 438/758 |

FOREIGN PATENT DOCUMENTS

| JP | 11-186698 | 7/1999 |
|---|---|---|
| JP | 2002-171048 | 6/2002 |

* cited by examiner

*Primary Examiner*—Kevin M Picardat
*Assistant Examiner*—Bac H Au
(74) *Attorney, Agent, or Firm*—Kratz, Quintos & Hanson, LLP

(57) ABSTRACT

A method of manufacturing a capacitor device of the present invention, includes the steps of, forming an insulating layer on a substrate, forming a recess portion in the insulating layer by an imprinting process, forming a lower electrode by filling a metal layer in the recess portion in the insulating layer, forming a photosensitive dielectric layer on the lower electrode, forming an upper electrode on the dielectric layer, and forming a dielectric layer pattern under the upper electrode by exposing/developing the dielectric layer while using the upper electrode as a mask.

5 Claims, 9 Drawing Sheets

CAPACITOR DEVICE AND METHOD OF MANUFACTURING THE SAME

CROSS-REFERENCE TO RELATED APPLICATIONS

This application is based on and claims priority of Japanese Patent Application No. 2004-312744 filed on Oct. 27, 2004, the entire contents of which are incorporated herein by reference.

BACKGROUND OF THE INVENTION

1. Field of the Invention

The present invention relates to a capacitor device and a method of manufacturing the same and, more particularly, a capacitor device that is arranged on a circuit substrate and applicable to a decoupling capacitor, a high-frequency filter, and the like and a method of manufacturing the same.

2. Description of the Related Art

In the prior art, there is the capacitor device that is arranged on the circuit substrate and functions as a decoupling capacitor, a high-frequency filter, or the like. In the method of manufacturing the capacitor device in the prior art, as shown in FIG. 1A, a first copper layer 102a is formed on a substrate 100, then a photosensitive dielectric layer 104a is formed thereon by a roller coater, or the like, and then a second copper layer 106a is formed on the dielectric layer 104a. In case the dielectric layer is formed by the roller coater, or the like, it become difficult to get the dielectric layer having a uniform film thickness when a surface of the underlying layer is uneven. Therefore, the dielectric layer 104a is formed on the flat first copper layer 102a.

Then, as shown in FIG. 1B, upper electrodes 106 for a capacitor are formed by patterning the second copper layer 106a. Then, the photosensitive dielectric layer 104a is exposed/developed while using the upper electrodes 106 as a mask. Thus, dielectric layer patterns 104 are formed under the upper electrodes 106 respectively.

Then, as shown in FIG. 1C, dry film resists 110 used to form a lower electrode are patterned on the upper electrodes 106 and the first copper layer 102a, and then the first copper layer 102a is etched by using the dry film resists 110 as a mask. Then, the dry film resists 110 are removed.

Thus, as shown in FIG. 1D, lower electrodes 102 are formed under the dielectric layer patterns 104 respectively. As a result, capacitors C each consisting of the lower electrode 102, the dielectric layer pattern 104, and the upper electrode 106 are obtained.

As described above, in order to ensure uniformity in the film thickness of the dielectric layer formed by the roller coater, such an approach was employed in the prior art that the dielectric layer 104a and the second copper layer 106a are formed on the flat first copper layer 102a, then the upper electrodes 106 and the dielectric layer patterns 104 are formed on the first copper layer 102a, and then the lower electrodes 102 are formed by patterning the first copper layer 102a.

As described above, in the method of manufacturing the capacitor device in the prior art, the dry film resist 110 must be patterned on a level difference caused by the dielectric layer pattern 104 and the upper electrode 106. For this reason, the dry film resist 110 cannot follow up such level difference, and thus a clearance A (FIG. 1C) is formed on the peripheral portion of the level difference.

Therefore, when an interval between a plurality of capacitors is narrowed (almost 200 μm or less), a defect such as a pattern separation of the dry film resist 110, or the like is caused, and thus it becomes difficult to form the lower electrodes 102 with good precision. As a consequence, in the prior art, an unnecessary wide interval must be provided between a plurality of capacitors, which prevents a miniaturization of the capacitor device.

SUMMARY OF THE INVENTION

It is an object of the present invention to provide a method of manufacturing a capacitor device, capable of a capacitor on a substrate without any disadvantage even when a dielectric layer is formed by using a roller coater, or the like, and a capacitor device.

The present invention is concerned with a method of manufacturing a capacitor device, which includes the steps of forming an insulating layer on a substrate, forming a recess portion in the insulating layer by an imprinting process, forming a lower electrode by filling a metal layer in the recess portion in the insulating layer, and forming a structure in which a dielectric layer pattern and an upper electrode are stacked on the lower electrode.

In one preferred embodiment of the present invention, the step of forming the structure in which the dielectric layer pattern and the upper electrode are stacked on the lower electrode includes the steps of forming a photosensitive dielectric layer on the lower electrode and the insulating layer, forming the upper electrode on a portion of the dielectric layer on the lower electrode as a pattern, and forming the dielectric layer pattern under the upper electrode by exposing/developing the dielectric layer while using the upper electrode as a mask.

In the present invention, first the recess portion is formed on the insulating layer on the substrate by the imprinting process, and then the lower electrode is formed to be buried in the recess portion. Accordingly, the flat surface can be obtained not to generate the level difference of the lower electrode. Then, the photosensitive dielectric layer is formed on the lower electrode and the insulating layer, and then the upper electrode is formed on the dielectric layer. Then, the dielectric layer pattern is formed under the lower electrode by exposing/developing the dielectric layer while using the upper electrode as a mask. As a result, the capacitor device composed of the lower electrode, the dielectric layer pattern, and the upper electrode can be obtained.

Since such manufacturing method is employed, the underlying layer (the lower electrode and the insulating layer) is planarized even when the dielectric layer is formed by the roller coater. Therefore, the dielectric layer having good uniformity of the film thickness can be formed, and thus the capacitor device having a small tolerance can be easily manufactured.

Also, unlike the prior art, the lower electrode is formed as the pattern before the dielectric layer pattern and the upper electrode are formed. Therefore, there is no necessity to provide an interval between the lower electrodes unnecessarily widely. As a result, an interval between a plurality of capacitors can be set narrower than the prior art, and the present invention can respond to the miniaturization of the capacitor device.

Also, since the pattern of the lower electrode is formed based on the imprinting process, a time and a cost required to form the lower electrode can be reduced rather than the case where the lower electrode is formed by the photolithography.

In Patent Literature 1 (Patent Application Publication (KOKAI) Hei 11-186698) and Patent Literature 2 (Patent Application Publication (KOKAI) 2002-171048), it is set forth that the recess portion is formed by pressing both surface sides of the resin substrate with the die while heating, and then the wiring pattern is formed by filling the conductor in the recess portion.

However, Patent Literatures 1 and 2 relates to the method of forming the wiring pattern on the wiring substrate. Hence, the above problems caused in manufacturing the capacitor device are not taken into account at all, and these literatures provide no suggestion as to the constitutions of the present invention.

Also, the present invention is concerned with a method of manufacturing a capacitor device, which includes the steps of forming a lower electrode over a substrate, forming an insulating layer on the lower electrode, forming an opening portion, from which the lower electrode is exposed, in a portion of the insulating layer on the lower electrode by an imprinting process, forming a dielectric layer pattern to be buried in the opening portion in the insulating layer; and forming an upper electrode on the dielectric layer pattern.

In the present invention, first the insulating layer is formed on the lower electrode formed over the substrate, and then the opening portion is formed on a portion of the insulating layer on the lower electrode by the imprinting process. Then, the dielectric layer pattern is formed to be buried in the opening portion in the insulating layer, and then the upper electrode is formed on the dielectric layer pattern.

The dielectric layer pattern buried in the opening portion in the insulating layer is formed by polishing the dielectric layer that is formed on the insulating layer to fill the opening portion in the insulating layer. When the dielectric layer is formed by the roller coater, it is possible that the film thickness is varied because the dielectric layer that is formed on the level difference. In this case, since the dielectric layer is polished finally to fill selectively the opening portion in the insulating layer and provide the dielectric layer pattern, the dielectric layer pattern can be formed to have good uniformity of the film thickness.

In addition, like the above invention, since the lower electrode is formed as the pattern before the dielectric layer pattern and the upper electrode are formed, it is not needed to set an interval between the lower electrodes unnecessarily widely. Therefore, like the above invention, the capacitor device that can have a small tolerance and respond to the miniaturization can be easily manufactured.

Also, the present invention is concerned with a capacitor device, which includes a substrate, an insulating layer formed on the substrate, a recess portion formed in the insulating layer, a lower electrode formed to be buried in the recess portion in the insulating layer, a dielectric layer pattern formed on the lower electrode, an upper electrode formed on the dielectric layer pattern.

Also, the present invention is concerned with a capacitor device, which includes a substrate, a lower electrode formed over the substrate, an insulating layer formed on the lower electrode, an opening portion formed in a portion of the insulating layer on the lower electrode, a dielectric layer pattern formed to be buried in the opening portion of the insulating layer, an upper electrode formed on the dielectric layer pattern.

The capacitor device of the present invention is manufactured by the above manufacturing method, and can reduce a tolerance and can respond easily to the miniaturization.

DETAILED DESCRIPTION OF THE PREFERRED EMBODIMENTS

Embodiments of the present invention will be explained with reference to the accompanying drawings hereinafter.

First Embodiment

FIGS. 2A to 2M are sectional views showing a method of manufacturing a capacitor device according to a first embodiment of the present invention.

Figure 1A:
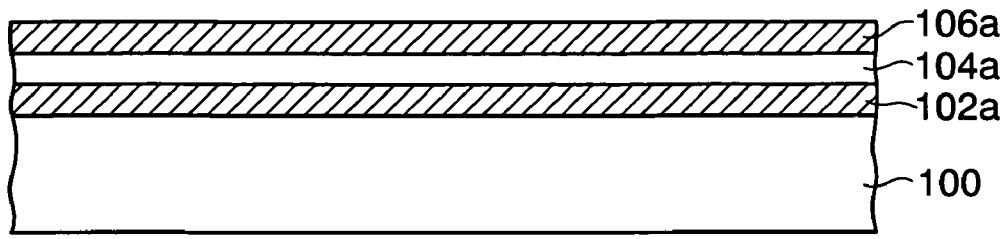
FIGS. 1A to 1D are sectional views showing a method of manufacturing a capacitor device in the prior art.
Figure 1B:
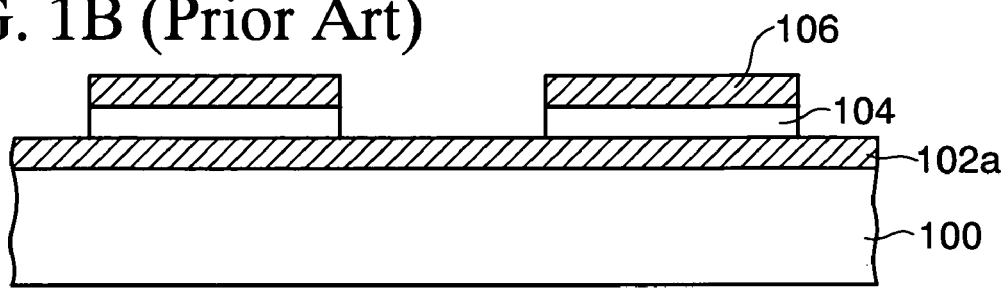
Figure 1C:
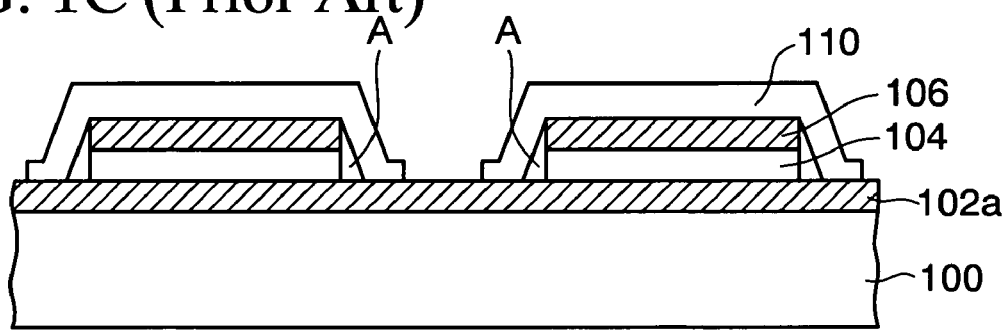
Figure 1D:
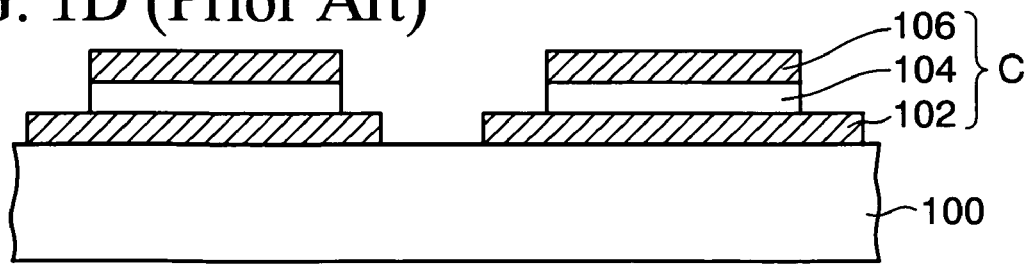
Figure 2A:
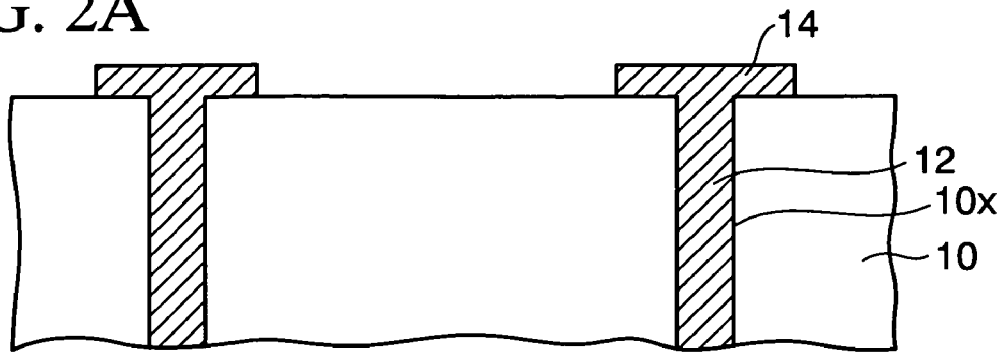
FIGS. 2A to 2M are sectional views showing a method of manufacturing a capacitor device according to a first embodiment of the present invention.

In the method of manufacturing a capacitor device in the first embodiment, as shown in FIG. 2A, first a core substrate 10 is prepared. Through holes 10x passing through the core substrate 10 are provided in the core substrate 10, and through electrodes 12 are formed in the through holes 10x. Also, first wiring layers 14 connected mutually via the through electrodes 12 are formed on both surface sides of the core substrate 10 (the lower surface side of the core substrate 10 is not illustrated).

Figure 2B:
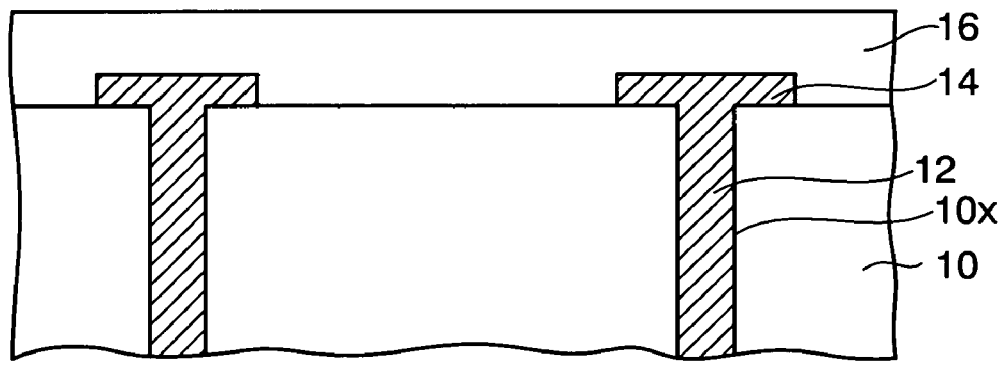
Figure 2C:
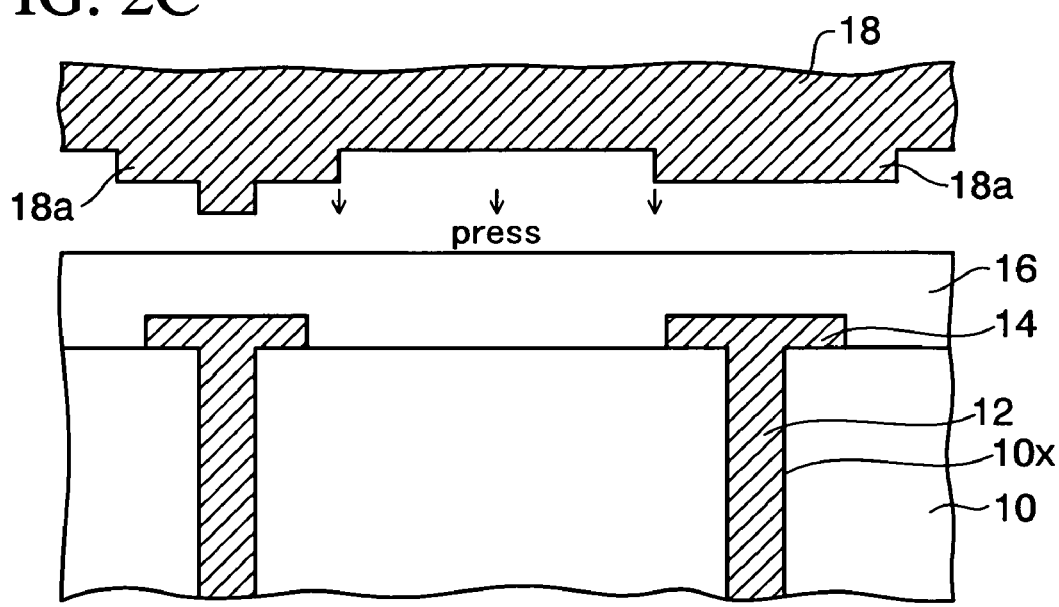

Then, as shown in FIG. 2B, a first interlayer insulating layer 16 for covering the first wiring layers 14 is formed by pasting a resin film on an upper surface of the core substrate 10. Then, as shown in FIG. 2C, a die 18 having projected portions 18a used in the imprinting process is prepared. Then, surfaces of the projected portions 18a are faced to the first interlayer insulating layer 16, and the first interlayer insulating layer 16 is pressed with this die 18.

Figure 2D:
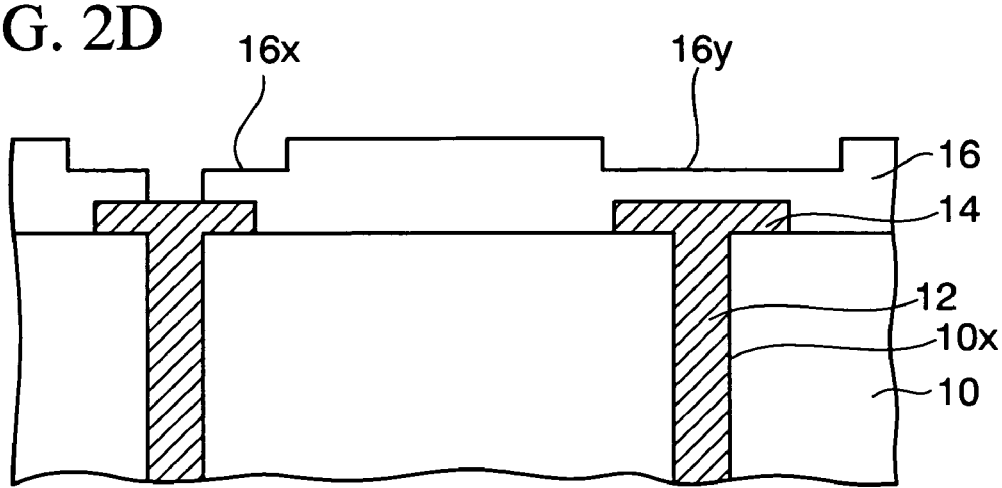

Accordingly, as shown in FIG. 2D, a first recess portion 16x and a second recess portion 16y are formed in portions of the first interlayer insulating layer 16, which are pushed by the projected portions 18a of the die 18. The first recess portion 16x is formed in a state that a part of an upper surface of the first wiring layers 14 is exposed, and the second recess portion 16y is formed in a state that the first interlayer insulating layer 16 is left between this second recess portion 16y and the underlying first wiring layers 14.

In this manner, the first and second recess portions 16x, 16y are formed on the first interlayer insulating layer 16 by the imprinting process. Then, inner surfaces of the first and second recess portions 16x, 16y are cleaned by the desmear process such as the permanganate method, or the like.

Figure 2E:
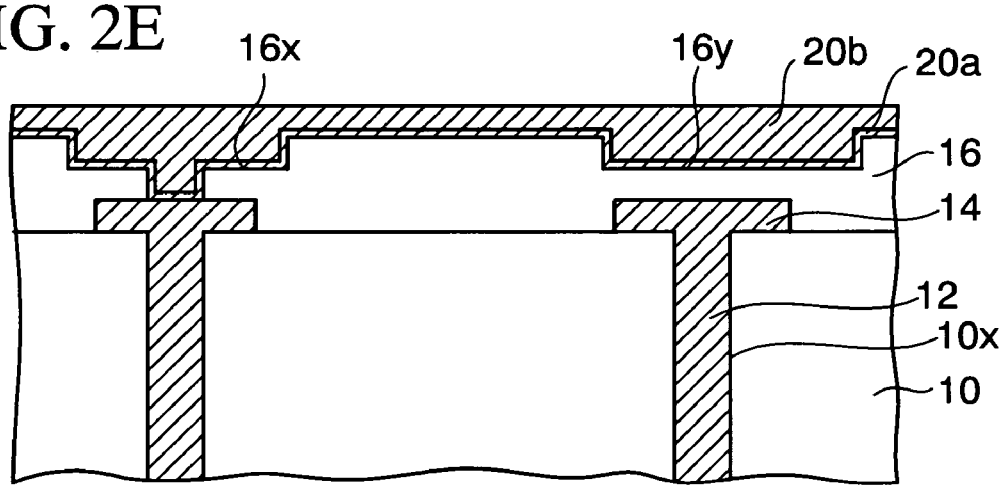

Then, as shown in FIG. 2E, a seed layer 20a made of copper (Cu), or the like is formed on the first interlayer insulating layer 16, on which the first and second recess portions 16x, 16y are formed, by the electroless plating. Then, a lower metal layer 20b is formed on the seed layer 20a by the electroplating utilizing the seed layer 20a as a plating power-supply layer. The lower metal layer 20b is formed on an overall upper surface of the core substrate 10 in a state that the first and second recess portions 16x, 16y in the first interlayer insulating layer 16 are buried by the lower metal layer 20b.

Figure 2F:
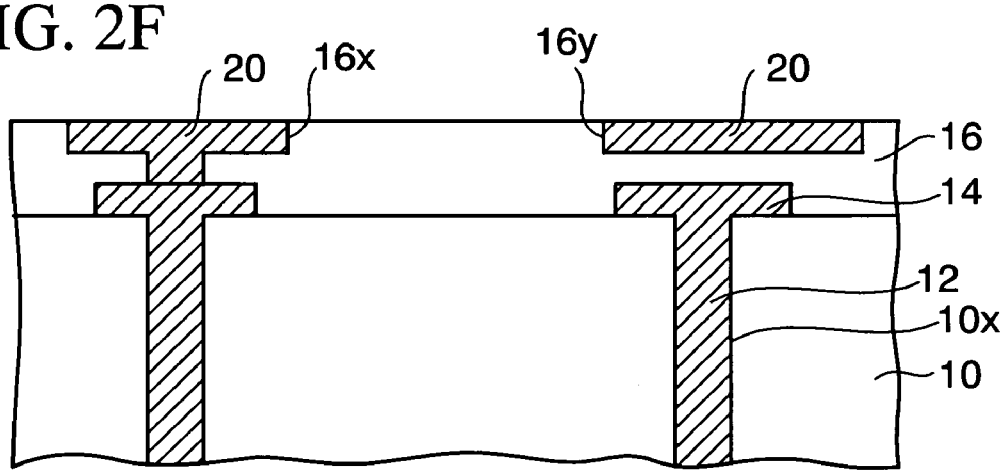

Then, as shown in FIG. 2F, the lower metal layer 20b and the seed layer 20a are polished until an upper surface of the first interlayer insulating layer 16 is exposed. Thus, the lower metal layer 20b and the seed layer 20a are buried in the first and second recess portions 16x, 16y, and lower electrodes 20 for a capacitor are obtained. As the polishing method, the mechanical polishing such as buff polishing, tape polishing, grinding, or the like or the CMP (Chemical Mechanical Polishing) may be employed.

In this manner, the lower electrodes 20 are formed to be buried in the first and second recess portions 16x, 16y of the first interlayer insulating layer 16, so that upper surfaces of the lower electrodes 20 and an upper surface of the first interlayer insulating layer 16 are planarized to constitute a coplanar surface.

Figure 2G:
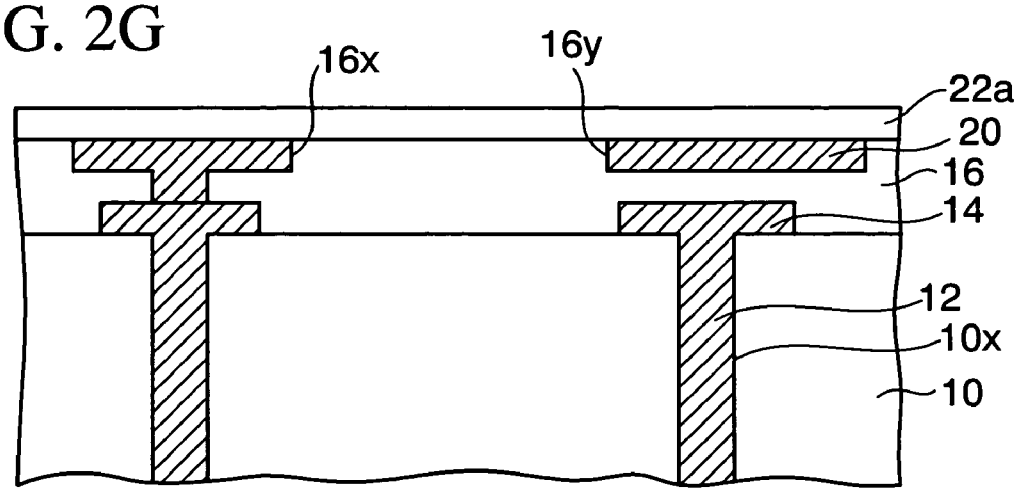

Then, as shown in FIG. 2G, a dielectric layer 22a is formed by coating a photosensitive epoxy resin containing ceramic fillers on the first interlayer insulating layer 16 and the lower electrodes 20 by means of the roller coater. As the material of the dielectric layer 22a, the high-dielectric material such as BST (barium strontium titanate), BTO (barium titanate), or the like may be used. Also, the dielectric layer 22a may be formed by using the screen printing or the spin coating method, in addition to the roller coater.

At this time, since the dielectric layer 22a is formed on the flat underlying layer (the first interlayer insulating layer 16 and the lower electrodes 20), such dielectric layer 22a can be formed to have a good uniformity of the film thickness.

Figure 2H:
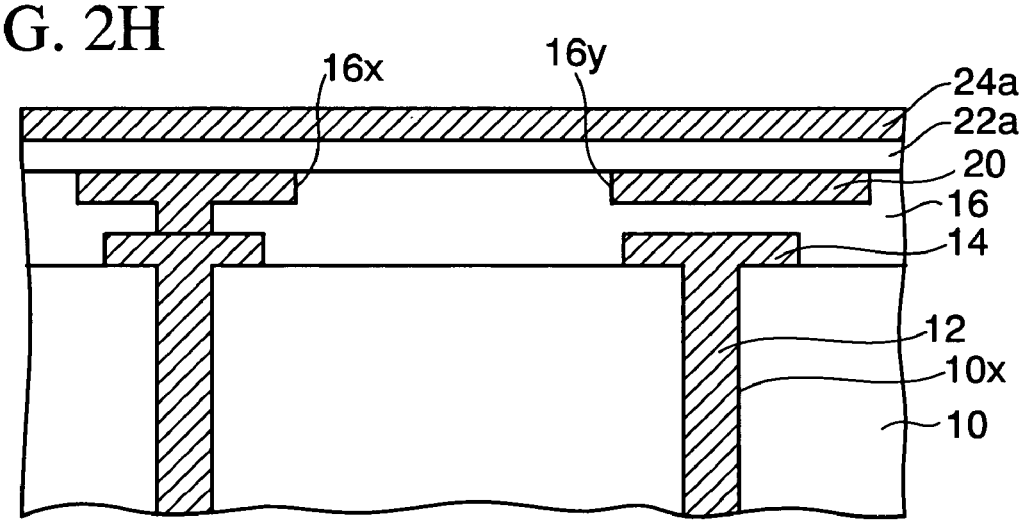
Figure 2I:
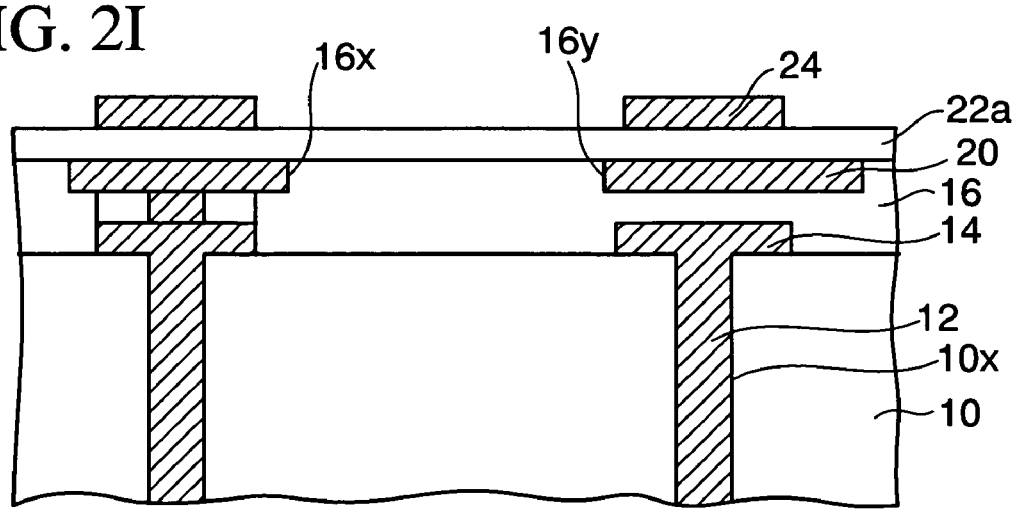
Figure 2J:
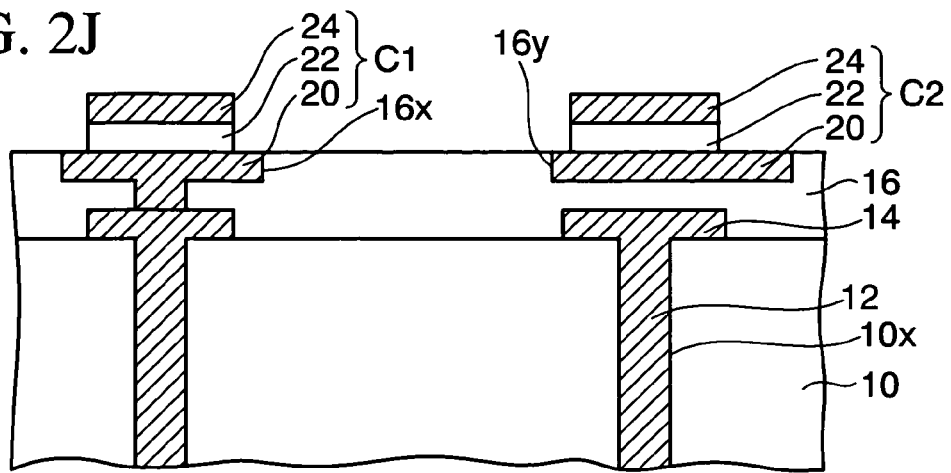

Then, as shown in FIG. 2H, an upper metal layer 24a is formed by pasting a copper foil on the dielectric layer 22a, or the like. Then, as shown in FIG. 2I, a resist film (not shown) is patterned on the upper metal layer 24a, and then upper electrodes 24 for a capacitor are formed on portions of the dielectric layer 22a over the lower electrodes 20 by etching the upper metal layer 24a while using the resist film as a mask. Then, as shown in FIG. 2J, the photosensitive dielectric layer 22a is exposed/developed by using the upper electrodes 24 as a mask. Thus, dielectric layer patterns 22 for a capacitor are formed under the upper electrodes 24. Then, the dielectric layer patterns 22 are cured by the annealing executed at a temperature of 150 to 170° C.

As a result, first and second capacitors C1, C2 each composed of the lower electrode 20, the dielectric layer pattern 22, and the upper electrodes 24 are formed. The first capacitor C1 is formed such that the lower electrode 20 is connected electrically to the first wiring layer 14 of the core substrate 10.

Figure 2K:
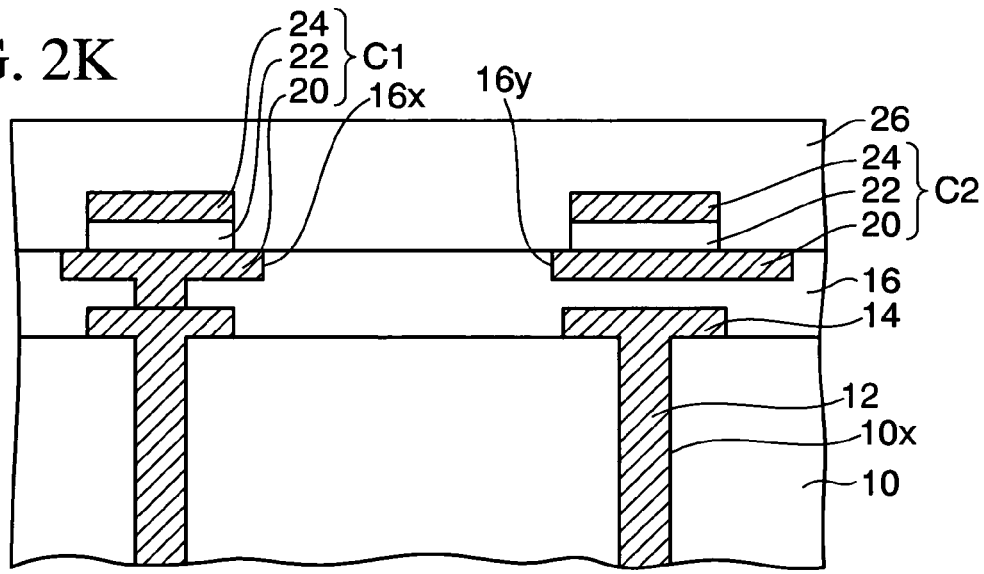
Figure 2L:
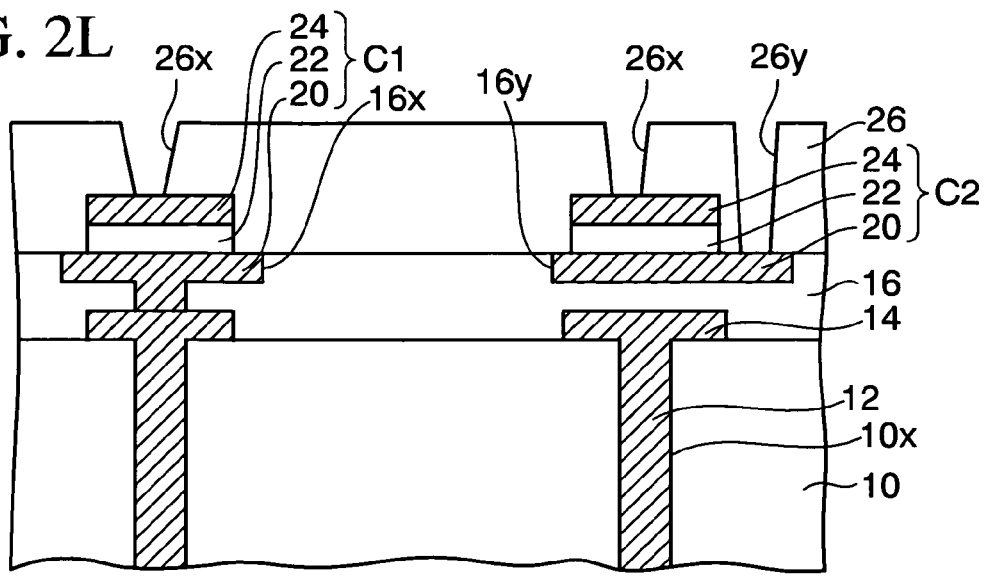

Then, as shown in FIG. 2K, a second interlayer insulating layer 26 for covering the first and second capacitors C1, C2 is formed by pasting a resin film, or the like on these first and second capacitors C1, C2. Then, as shown in FIG. 2L, first via hole 26x having a depth that reaches the upper electrodes 24 of the first and second capacitors C1, C2 respectively is formed by processing the second interlayer insulating layer 26 by means of the drill or the laser. At this time, a second via hole 26y is also formed in a portion of the second interlayer insulating layer 26 on the lower electrode 20 of the second capacitor C2.

Figure 2M:
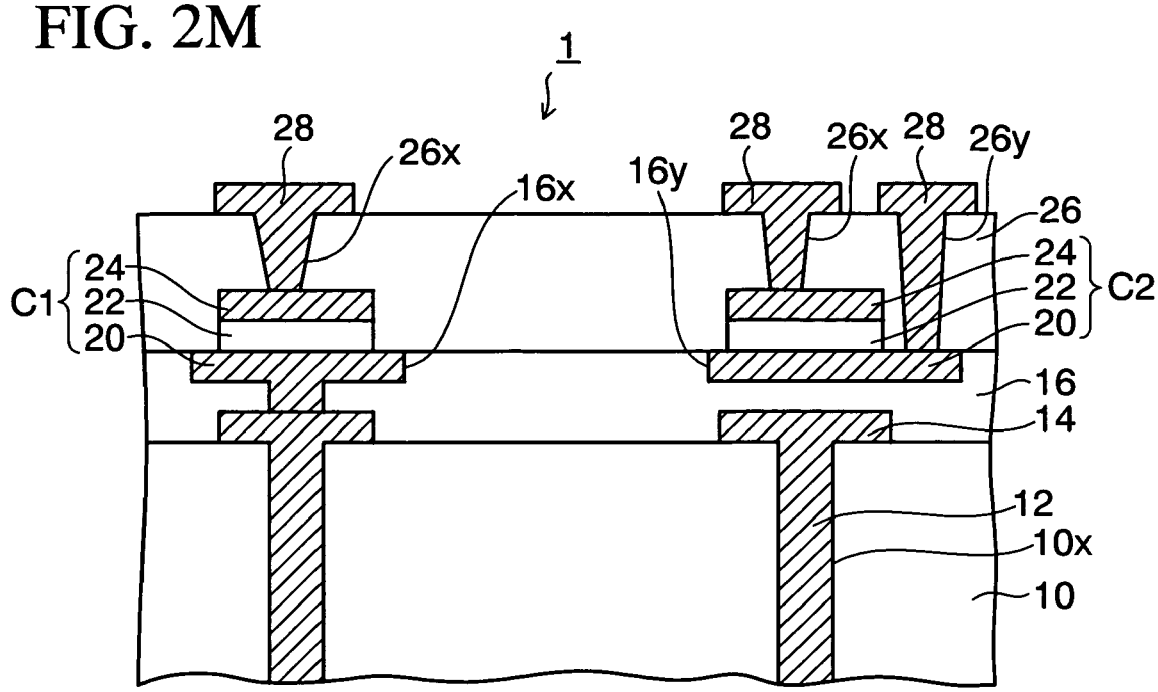

Then, as shown in FIG. 2M, second wiring layers 28 are formed on the second interlayer insulating layer 26. The second wiring layer 28 is connected to the upper electrodes 24 of the first and second capacitors C1, C2 via the first via hole 26x respectively, and also connected to the lower electrode 20 of the second capacitor C2 via the second via hole 26y.

The second wiring layer 28 is formed by the semi-additive process, for example. Explaining in detail, first a seed layer (not shown) is formed in an upper surface of the second interlayer insulating layer 26 and inner surfaces of the first and second via holes 26x, 26y, and then a resist film (not shown) in which opening portions are provided in portions of the seed layer, in which the second wiring layer 28 is formed respectively, is patterned. Then, metal layer patterns (not shown) are formed in the opening portions in the resist film by the electroplating utilizing the seed layer as the plating power-supply layer. Then, the resist film is removed, and then the second wiring layers 28 are formed by etching the seed layer while using the metal layer patterns as a mask.

With the above, a circuit substrate 1 according to the first embodiment of the present invention, in which the first and second capacitors C1, C2 are built, can be obtained. As shown in FIG. 2M, in the capacitor device (the first and second capacitors C1, C2) of the first embodiment, the lower electrodes 20 are formed to be buried in the first and second recess portions 16x, 16y that are formed in the first interlayer insulating layer 16 on the core substrate 10 by the imprinting process, and also the upper surfaces of the lower electrodes 20 and the upper surface of the first interlayer insulating layer 16 are planarized to constitute the coplanar surface. Also, the dielectric layer pattern 22 and the upper electrode 24 are formed on the lower electrode 20.

In the first capacitor C1, the lower electrode 20 is connected to the underlying first wiring layer 14 on the core substrate 10, and the upper electrode 24 is connected to the overlying second wiring layer 28 via the first via hole 26x. Also, in the second capacitor C2, the upper electrode 24 is connected to the second wiring layer 28 via the first via hole 26x, and the lower electrode 20 is connected to the second wiring layer 28 via the second via hole 26y.

In the method of manufacturing the capacitor device of the first embodiment, first the first and second recess portions 16x, 16y are formed in the first interlayer insulating layer 16 on the core substrate 10 by the imprinting process. Then, the lower electrode 20 is formed to be buried in the first and second recess portions 16x, 16y. Accordingly, the level difference is not generated, and thus the upper surfaces of the lower electrodes 20 and the upper surface of the first interlayer insulating layer 16 are planarized to constitute the coplanar surface.

Then, the dielectric layer 22a is formed on the first interlayer insulating layer 16, in which the lower electrodes 20 are buried, by the roller coater, and then the upper metal layer 24a is formed on the dielectric layer 22a. At this time, since the lower electrodes 20 are formed flat not to generate the level difference, the dielectric layer 22a having good uniformity of the film thickness can be formed by the roller coater without any disadvantage. Then, the upper electrode 24 and the dielectric layer pattern 22 are formed on the lower electrode 20 by patterning the upper metal layer 24a and the dielectric layer 22a.

In this fashion, in the present embodiment, the lower electrodes 20 are formed to be buried in the first interlayer insulating layer 16 based on the imprinting process to get the flat surface, then the dielectric layer 22a and the upper electrodes 24 are formed, and then the dielectric layer patterns 22 are formed under the upper electrodes 24 by patterning the dielectric layer 22a. Therefore, unlike the prior art, the disadvantage in the photolithography in the step of forming the lower electrodes after the upper electrodes and the dielectric layer patterns are formed is not generated, so that a plurality of lower electrodes 20 can be arranged and formed with the precision that is attained in forming the recess portions 16x, 16y on the first interlayer insulating layer 16 by the imprinting process. As a result, there is no need to provide the unnecessarily wide interval between a plurality of lower electrodes 20, the interval between a plurality of capacitors can be narrowed rather than the prior art, whereby the present embodiment can respond to the miniaturization of the capacitor device.

Also, in the present embodiment, since the lower electrodes 20 are formed based on the imprinting process, a time and a cost required to form the lower electrodes 20 can be reduced rather than the case where the lower electrodes 20 are formed by the photolithography method.

Further, the lower electrodes 20 are buried in the first and second recess portions 16x, 16y in the first interlayer insulating layer 16 to constitute the flat surface. As a result, even when the dielectric layer 22a is formed on the lower electrodes 20 by the roller coater, or the like, a uniformity of the film thickness can be maintained and thus the capacitor having a small tolerance can be manufactured.

Second Embodiment

FIGS. 3A to 3I are sectional views showing a method of manufacturing a capacitor device according to a second embodiment of the present invention. The second embodiment shows such a mode that dielectric layer patterns of the capacitors are formed to be buried in the insulating layer on the basis of the imprinting process. Detailed explanation about the same steps as those in the first embodiment will be omitted herein.

Figure 3A:
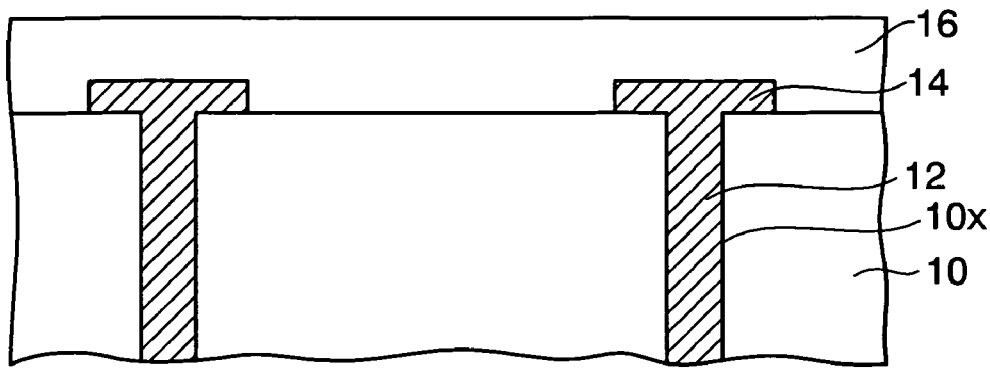
FIGS. 3A to 3I are sectional views showing a method of manufacturing a capacitor device according to a second embodiment of the present invention.

First, as shown in FIG. 3A, like FIG. 2B in the first embodiment, the core substrate 10 having the through holes 10x, the through electrodes 12 provided in the through holes 10x, and the first wiring layers 14 connected to the through electrodes 12 is prepared. Then, the first interlayer insulating layer 16 is formed on the upper surface of the core substrate 10.

Figure 3B:
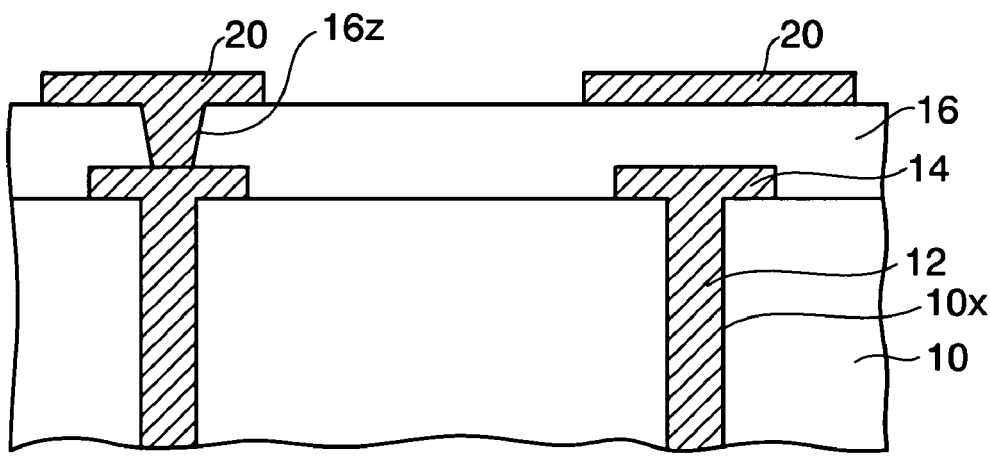

Then, as shown in FIG. 3B, a contact hole 16z having a depth that reaches the first wiring layer 14 is formed by processing the first interlayer insulating layer 16 by means of the drill or the laser. Then, as also shown in FIG. 3B, the lower electrodes 20 made of Cu, or the like are formed on the first interlayer insulating layer 16 by the semi-additive process, or the like. The lower electrode 20 for the first capacitor (on the left side in FIG. 3B) is connected electrically to the first wiring layer 14 via the contact hole 16z. In contrast, the lower electrode 20 for the second capacitor (on the right side in FIG. 3B) is formed as a floating electrode.

Figure 3C:
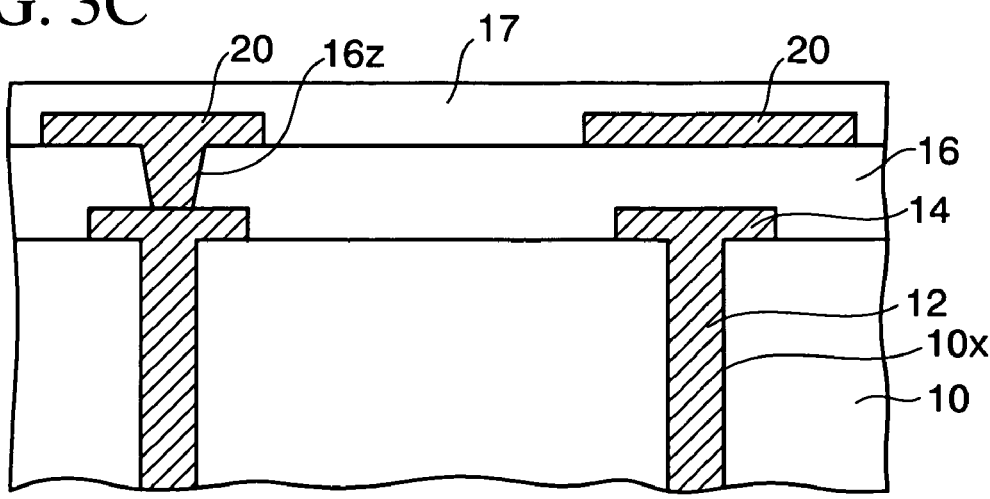

Then, as shown in FIG. 3C, an intermediate insulating layer 17 for covering the lower electrodes 20 is formed by pasting a resin film on the lower electrodes 20 and the first interlayer insulating layer 16, or the like.

Figure 3D:
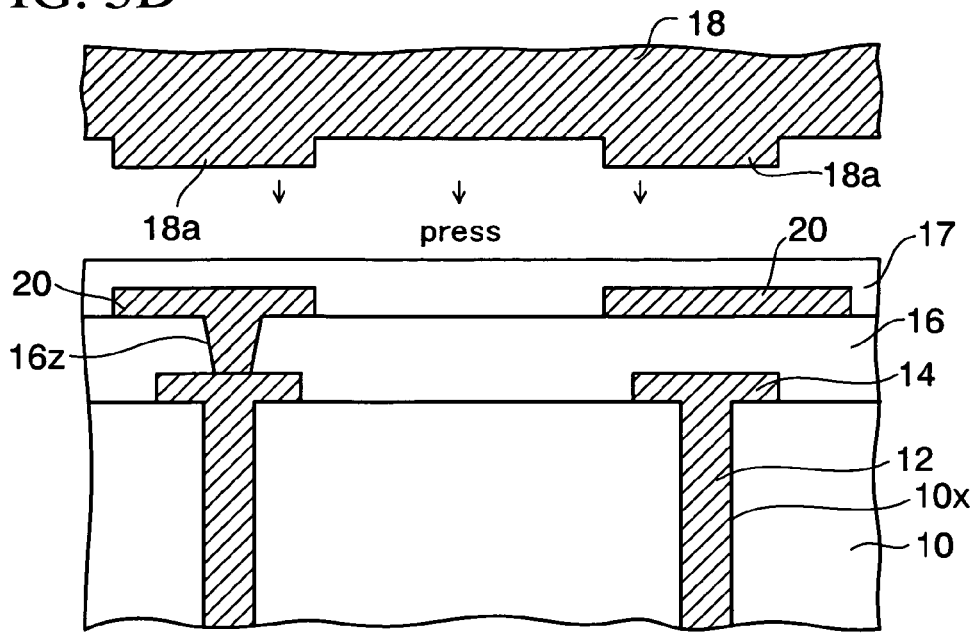

Then, as shown in FIG. 3D, the die 18 having the projected portions 18a used in the imprinting process is prepared. Then, the intermediate insulating layer 17 is pressed with the die 18 while opposing surfaces of the projected portions 18a to the intermediate insulating layer 17.

Figure 3E:
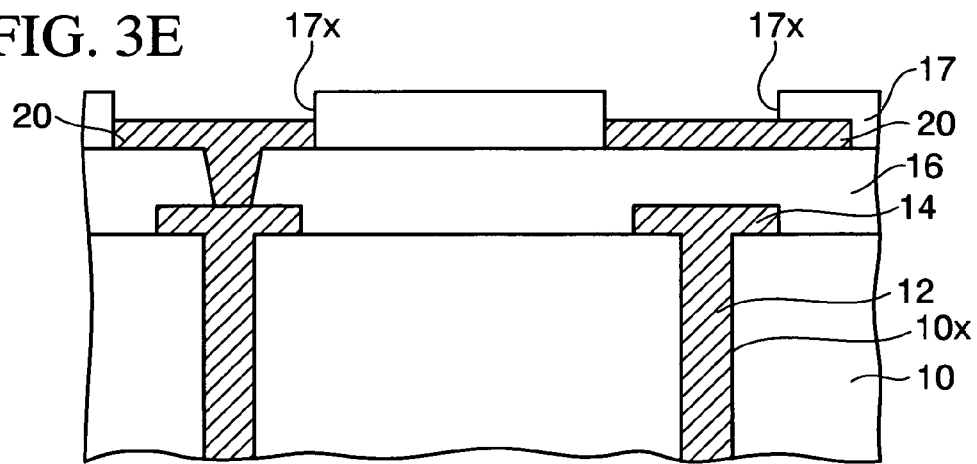

Accordingly, as shown in FIG. 3E, opening portions 17x are formed in portions of the intermediate insulating layer 17 on the lower electrodes 20. Thus, the upper surfaces of the lower electrodes 20 are exposed from bottom portions of the opening portions 17x. In this manner, the opening portions 17x are formed in the intermediate insulating layer 17 by the imprinting process. Then, inner surfaces of the opening portions 17x in the intermediate insulating layer 17 are cleaned by the desmear process.

Figure 3F:
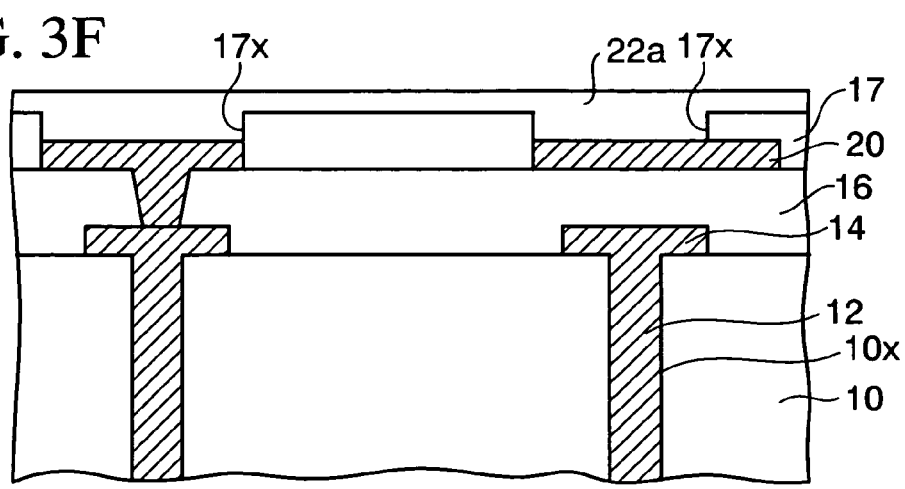

Then, as shown in FIG. 3F, the dielectric layer 22a made of an epoxy resin containing ceramic fillers, or the like is formed on the intermediate insulating layer 17 and in the opening portions 17x by the roller coater, or the like. The dielectric layer 22a is formed on the intermediate insulating layer 17 in a state that such layer is buried in the opening portions 17x in the intermediate insulating layer 17. As the material and the forming method of the dielectric layer 22a, the same material and method as those in the first embodiment are used. In the second embodiment, since the dielectric layer patterns are formed to be buried in the opening portions 17x in the intermediate insulating layer 17 by polishing the dielectric layer 22a in the next step, there is no need to employ the photosensitive material.

Figure 3G:
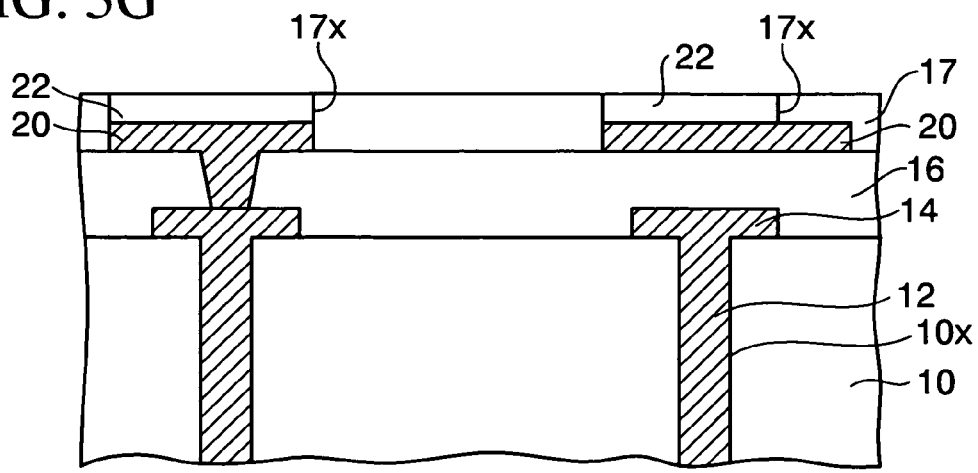

Then, as shown in FIG. 3G, the dielectric layer 22a is polished until the upper surface of the intermediate insulating layer 17 is exposed. Thus, the dielectric layer patterns 22 are obtained by filling the dielectric layer 22a in the opening portions 17x in the intermediate insulating layer 17. As the polishing method, the mechanical polishing such as buff polishing, tape polishing, grinding, or the like or the CMP (Chemical Mechanical Polishing) may be employed.

In this case, when the dielectric layer 22a is formed by the roller coater (FIG. 3F), level differences are generated on the underlying layer because of the presence of the opening portions 17x in the intermediate insulating layer 17. Thus, it is possible that a film thickness of the dielectric layer 22a is varied. However, since the dielectric layer 22a is polished finally to fill the opening portions 17x in the intermediate insulating layer 17 and provide the dielectric layer patterns 22, no disadvantage is generated even when a film thickness of the dielectric layer 22a is varied prior to the polishing. That is, the dielectric layer patterns 22 a film thickness of which corresponds to a depth of the opening portion 17x in the intermediate insulating layer 17 can be formed with good precision.

Figure 3H:
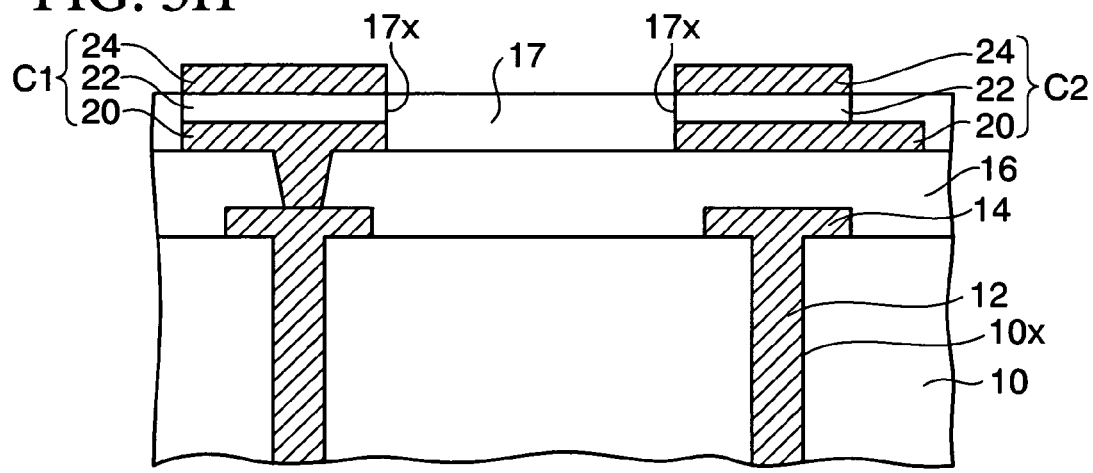

Then, as shown in FIG. 3H, a metal layer (not shown) made of Cu, or the like is formed on the dielectric layer patterns 22 and the intermediate insulating layer 17, and then the upper electrodes 24 are formed on the dielectric layer patterns 22 by patterning the metal layer by means of the photolithography. As a result, the first and second capacitors C1, C2 each constructed by the lower electrode 20, the dielectric layer pattern 22, and the upper electrode 24 can be obtained.

Figure 3I:
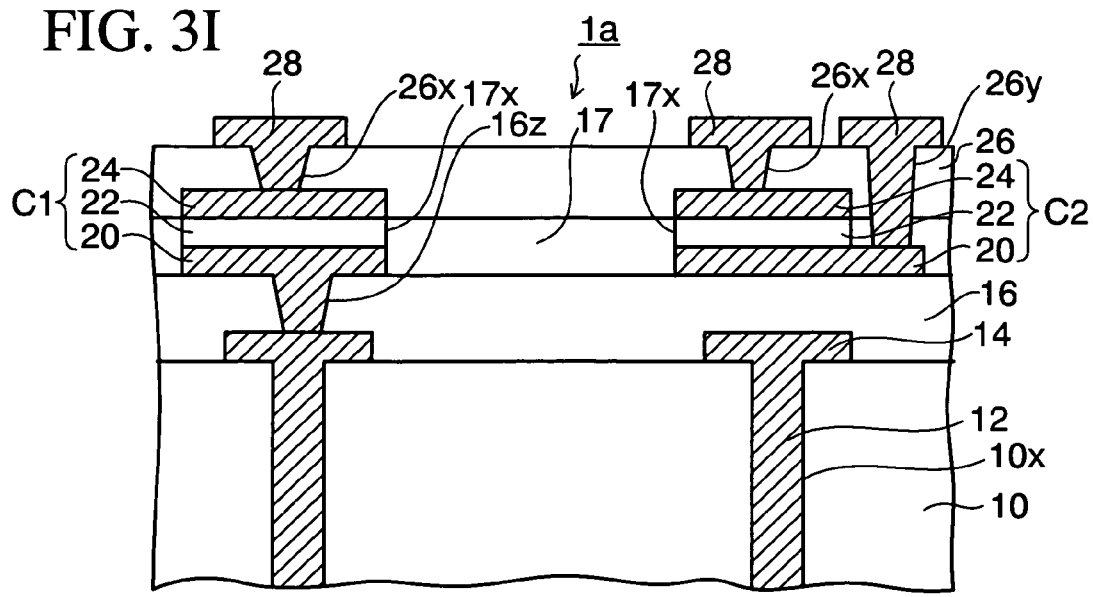

Then, as shown in FIG. 3I, like the first embodiment, the second interlayer insulating layer 26 for covering the first and second capacitors C1, C2 is formed. Then, the first via hole 26x having a depth that reach the upper electrodes 24 of the first and second capacitors C1, C2 respectively and the second via hole 26y having a depth that reaches the lower electrode 20 of the second capacitor C2 are formed by processing the second interlayer insulating layer 26 by means of the drill or the laser.

Then, as also shown in FIG. 3I, the second wiring layer 28 is formed on the second interlayer insulating layer 26. Like the first embodiment, the second wiring layer 28 is connected to the upper electrodes 24 of the first and second capacitors C1, C2 via the first via hole 26x respectively and is connected to the lower electrode 20 of the second capacitor C2 via the second via hole 26y.

With the above, a circuit substrate 1a in which the capacitor device (the first and second capacitors C1, C2) of the second embodiment of the present invention is built is obtained.

As shown in FIG. 3I, in the capacitor device (the first and second capacitors C1, C2) of the second embodiment, the lower electrodes 20 are formed on the first interlayer insulating layer 16 on the core substrate 10, and also the opening portions 17z formed by the imprinting process are provided in portions of the intermediate insulating layer 17 on the lower electrodes 20. Then, the dielectric layer patterns 22 are formed to be buried in the opening portions 17z, and thus the upper surfaces of the dielectric layer patterns 22 and the upper surface of the intermediate insulating layer 17 are planarized to constitute the coplanar surface. Then, the upper electrodes 24 are formed on the dielectric layer patterns 22.

In the first capacitor C1, the lower electrodes 20 is connected to the underlying first wiring layer 14 on the core substrate 10 via the contact hole 16z, and the upper electrode 24 is connected to the overlying second wiring layer 28 via the first via hole 26x. Also, in the second capacitor C2, the upper electrode 24 is connected to the second wiring layer 28 via the first via hole 26x, and the lower electrodes 20 is connected to the second wiring layer 28 via the second via hole 26y.

In the method of manufacturing the capacitor in the second embodiment, first the lower electrodes 20 and the intermediate insulating layer 17 are formed on the first interlayer insulating layer 16, and then the opening portions 17x from which the upper surface of the lower electrode 20 is exposed respectively are formed in the portions of the intermediate insulating layer 17 on the lower electrodes 20 by the imprinting process. Then, the dielectric layer 22a that fills the opening portions 17x is formed on the intermediate insulating layer 17 by the roller coater, or the like. Then, the dielectric layer 22a is polished to fill the dielectric layer patterns 22 in the opening portions 17x of the intermediate insulating layer 17. Then, the upper electrodes 24 are formed on the dielectric layer patterns.

In this manner, in the second embodiment, such an approach is employed that the opening portions 17x are formed previously in the portions of the intermediate insulating layer 17 on the lower electrodes 20 by the imprinting process, then the dielectric layer 22a to be buried in the opening portions 17x is formed by the roller coater, and then the dielectric layer patterns 22 are buried in the opening portions 17x by polishing the dielectric layer 22a.

Accordingly, even though the dielectric layer 22a is formed by using the roller coater, the dielectric layer patterns 22 having good uniformity of the film thickness can be obtained without any disadvantage for the above reasons. Thus, the capacitor device having a small tolerance can be easily manufactured.

Also, like the first embodiment, since the lower electrodes 20 are formed as the pattern unlike the prior art before the upper electrodes 24 and the dielectric layer patterns 22 are formed, the disadvantage caused in the prior art by the photolithography in forming the lower electrodes is never generated. Therefore, an interval between plural capacitors can be made narrower than the prior art, and the second embodiment can respond to the miniaturization of the capacitor device.

In this event, such a mode may be employed by combining the first embodiment and the second embodiment together that the lower electrodes 20 are buried in the first and second recess portions 16x, 16y of the first interlayer insulating layer 16 and also the dielectric layer patterns 22 are buried in the opening portions 17x of the intermediate insulating layer 17 on the lower electrodes 20. Also, in addition to this, the upper electrodes 24 may be formed to be buried in the opening portions in the insulating layer on the dielectric layer patterns 22.

What is claimed is:

1. A method of manufacturing a capacitor device, comprising the steps of:
    forming an insulating layer formed of a resin film on a substrate including a wiring layer;
    forming a first recess portion exposing at least one part of the wiring layer and a second recess portion wherein the insulating layer is left covering the wiring layer by pushing the insulating layer with a die having projected portions using an imprinting process;
    obtaining lower electrodes respectively by filling a metal layer in the first recess portion and the second recess portion;
    forming a first capacitor in which a dielectric layer pattern and an upper electrode are formed on the lower electrode in the first recess portion, and a second capacitor in which a dielectric layer pattern and an upper electrode are formed on the lower electrode in the second recess portion, the lower electrode of the second capacitor having an extending portion that extends outside from the dielectric layer pattern and the upper electrode;
    forming an upper insulating layer on the first capacitor and the second capacitor;
    forming via holes reaching the upper electrode of the first capacitor, and reaching the upper electrode and the extending portion of the lower electrode of second capacitor by processing the upper insulation layer;
    forming upper wiring patterns connected to the upper electrode of the first capacitor and connected to the upper electrode and the extending portion of the lower electrode of the second capacitor on the upper insulating layer.

2. A method of manufacturing a capacitor device, according to claim 1, wherein the step of forming the first capacitor and the second capacitor includes the steps of:
    forming a photosensitive dielectric layer on the lower electrode and the insulating layer;
    forming the upper electrode on a portion of the dielectric layer on the lower electrode as a pattern; and
    forming the dielectric layer pattern under the upper electrode by exposing/developing the dielectric layer while using the upper electrode as a mask.

3. A method of manufacturing a capacitor device, according to claim 2, wherein, in the step of forming the dielectric layer, the dielectric layer is formed by a roller coating, a screen printing, or a spin coating.

4. A method of manufacturing a capacitor device, according to claim 1, wherein, in the step of forming the lower electrode, an upper surface of the lower electrode and an upper surface of the insulating layer constitute a coplanar surface.

5. A method of manufacturing a capacitor device, according to claim 1, wherein the step of forming the lower electrode by filling the metal layer in the recess portion in the insulating layer includes the steps of:
    forming a seed layer on the insulating layer and in the recess portion;
    forming the metal layer, which is buried in the recess portion, on the seed layer by an electroplating utilizing the seed layer as a plating power-supply layer; and
    forming the lower electrode by polishing the metal layer and the seed layer until an upper surface of the insulating layer is exposed, to fill the metal layer and the seed layer in the recess portion.

\* \* \* \* \*